United States Patent [15] 3,681,711
Hanby [45] Aug. 1, 1972

[54] BLOCKING OSCILLATOR WITH EXTENDED VARIABLE PULSE

[72] Inventor: Fredrick E. Hanby, Garden Grove, Calif.

[73] Assignee: Tasker Industries, Los Angeles, Calif.

[22] Filed: Oct. 16, 1970

[21] Appl. No.: 81,244

[52] U.S. Cl. ....................331/112, 307/275, 331/149
[51] Int. Cl. ..............................................H03k 3/30
[58] Field of Search...............331/112, 146, 148, 149

[56] References Cited

UNITED STATES PATENTS 3,249,892 5/1966 Van Geen.....................331/148

FOREIGN PATENTS OR APPLICATIONS

43/16011 1/1968 Great Britain................331/112
43-16011 9/1964 Japan............................331/112

*Primary Examiner*—John Kominski
*Attorney*—Lewis M. Dalgarn

[57] ABSTRACT

In a blocking oscillator circuit, a unidirectional device, such as a diode, in series with a selectively valued resistor is coupled between the input terminals of the active amplifier element, such as between the emitter and base of a transistor, in series with the secondary winding of a pulse transformer or the like providing regenerative positive feedback to selectively limit the development of reverse potential exceeding cutoff levels during the initial portion of an operating cycle.

8 Claims, 2 Drawing Figures

PATENTED AUG 1 1972 3,681,711

INVENTOR
FREDRICK E. HANBY
BY
Lewis McDalgarn
ATTORNEY.

BLOCKING OSCILLATOR WITH EXTENDED VARIABLE PULSE

BACKGROUND OF THE INVENTION

1. Field of the Invention

This invention relates to improved blocking oscillator circuits providing extended pulse widths and pulses of variable duration.

2. Background of the Invention

Various forms of blocking oscillators are employed for generating very short duration pulses. Generally, such circuits employ a single stage active amplifier element with its output coupled through a reactive feedback element, usually a pulse transformer, to provide regenerative positive feedback to the input. The duration of each pulse normally depends solely upon the delay or storage effect provided by the reactance values of the feedback pulse transformer or the like, thus limiting the available output pulse to a fixed duration usually less than thirty microseconds.

Previously where pulses of more extended duration or of variable widths are required, multivibrator type circuits had to be used. These employ two or more active amplifier elements and thus, as compared to blocking oscillators, require significantly more circuit components. Also one of the two active elements must necessarily always remain in the conducting state, which wastefully consumes power even when a pulse is not being generated. In large scale pulse systems such as computers and control networks with numerous pulse generating circuits, large amounts of power are continuously consumed by multivibrators significantly increasing the cost of operation and frequently requiring auxiliary cooling equipment or the like for dissipating the heat generated.

BRIEF SUMMARY OF THE INVENTION

In a conventional blocking oscillator circuit, a unidirectional device such as a diode is coupled in series with a variable resistance in the input circuit to shunt regenerative feedback developed during initiation of an output pulse, thus selectively limiting voltage excursion beyond cutoff in the input circuit. In preventing the buildup of maximum voltage values beyond cutoff during regenerative feedback, the input signal to the active amplifier element can be driven substantially beyond saturation levels so that a significantly greater decrease in the regenerative feedback is required before the input reaches the cutoff level to terminate the output pulse. The duration of the output pulse may be varied by adjusting the variable resistance in the shunt path through the unidirectional device.

In a preferred embodiment illustrated and described herein, a standard common emitter blocking oscillator circuit may be either of the free-running type producing repetitive pulses or the externally trigger type producing an output pulse only upon receipt of an input pulse. This circuit, besides the standard component of a common emitter blocking oscillator, has a diode in series with a variable resistor coupled between the secondary winding of the feedback transformer and the emitter terminal of the transistor to provide a variable low resistance shunt path for the regenerative positive feedback developed during initiation of an output pulse. Dissipation of the regenerative feedback through this low impedance path limits the buildup of voltages in the direction of cutoff on capacitive storage elements within the input circuit developed in opposition to the regenerative feedback voltage across the transformer secondary. In this way, the base of the transistor is driven substantially beyond saturation during the regenerative portion of the cycle so a substantial decrease in the feedback level, exceeding that required in normal operation, is required before the input at the transistor base is reduced below saturation level, thus extending the period during which the transistor continues conduction.

DETAILED DESCRIPTION

Figure 1:
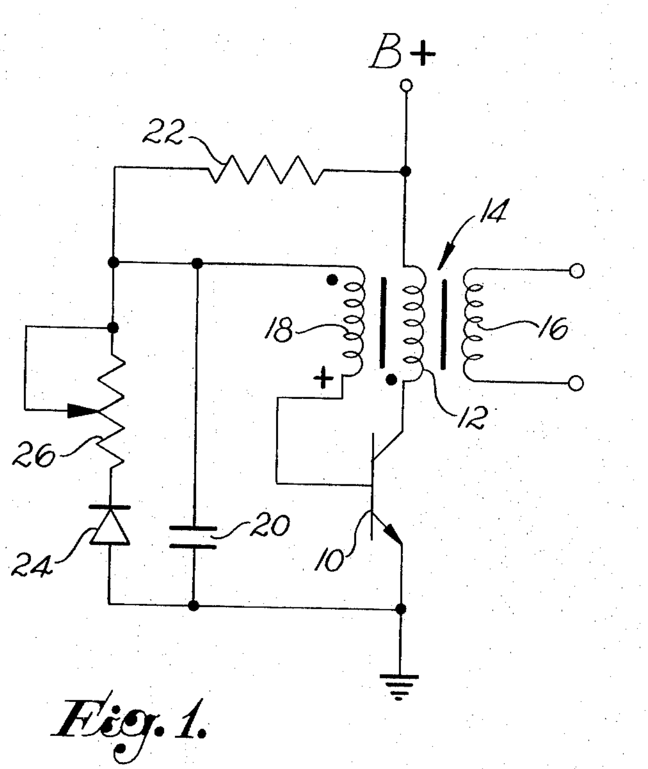
FIG. 1 is a schematic circuit diagram illustrating a preferred form of the invention providing an improved free-running type of blocking oscillator circuit; and, FIG. 2 is a schematic circuit diagram showing another preferred form of the invention providing an improved triggered type of blocking oscillator circuit.

Referring now to FIG. 1, the improvement in accordance with the invention may be incorporated as shown with a conventional common emitter blocking oscillator circuit of the free-running type to provide extended pulse widths of selectively variable duration. In this configuration, the active amplifier element consists of a NPN-transistor 10 with its emitter terminal coupled to ground potential or a negative B— voltage source and its collector terminal coupled to a positive B+ voltage supply through the primary winding 12 of a pulse transformer arrangement 14 which has inductively coupled secondary windings consisting of an output winding 16 and feedback winding 18. As shown by the polarity dot markings, the feedback secondary winding 18 is oppositely wound with respect to the primary windings 12 with one of its terminals connected to the base of the transistor 10 to provide a positive regenerative feedback as hereinafter described. The other terminal of the feedback winding 18 is connected to one plate of the capacitor 20 that has its other plate coupled to the emitter of the transistor 10 at ground potential. Charging current from the B+ positive voltage supply is applied through a resistor 22 to the common terminal between the secondary feedback winding 18 of the pulse transformer 14 and the capacitor 20, with the resistor 22 and the capacitor 20 forming an RC timing circuit determinative of the repetition rate of the pulses produced during free-running operation.

The elements so far identified constitute the basic components of a conventional common emitter type of blocking oscillator. In accordance with the invention, a junction diode 24 or other unidirectional device connected in series with a variable resistor 26 is also provided as a shunt across the capacitor 20. This forms a relatively low resistance path in parallel to bypass the capacitor 20 whenever a negative voltage is impressed across it as by application of the regenerative positive feedback from the secondary winding 18 during the initial portion of each pulse interval. In this case, with the anode of the diode 24 coupled to ground potential at the emitter of transistor 10, and its cathode coupled through the variable resistor 26 to the common terminal between the capacitor 20 and the secondary feedback winding 18, the diode 24 conducts to provide a shunt path to inhibit further discharge of the capacitor 20 once a negative charge develops across it.

An understanding of the unique advantages offered by this improvement can best be appreciated by first considering operation of the conventional common emitter type of blocking oscillator such as would result from disconnecting the shunt path through the diode 24 and variable resistor 26, or by selecting a high resistance value for the variable resistor 26. Assuming that the circuit is initially in its quiescent state during the interval between pulses, or at the time that an operating B+ positive potential is first applied to the circuit, the transistor 10 is essentially non-conducting with only a very small collector current being drawn through the primary winding 12 resulting from stray capacitance and leakage currents. At the same time, charging current from the B+ supply flows through the relatively high resistance of the resistor 22 to charge the capacitor 20 in the positive direction. When the positive charge on the capacitor 20 reaches a predetermined positive voltage level, the base terminal of the transistor 10 becomes positive with respect to emitter, and the resulting base current flow begins to turn on the transistor 10, allowing the flow of collector current through the primary winding 12 of the pulse transformer 14. The increased current flow through the primary winding 12 results in a positive feedback voltage across the secondary winding 18 by reason of the mutual inductance between the windings so that the terminal connected to the transistor base becomes positive with respect to its other winding terminal. This positive feedback produces additional base current flow causing a regenerative effect that further increases the collector current flow through the primary winding 12 which in turn further increases the level of positive feedback so that the collector-to-emitter current flow through the transistor 10 quickly approaches the saturation level.

As the transistor 10 reaches saturation, the rate of increase in the collector current through the primary winding 12 drops off causing a decrease in the amount of positive feedback voltage on the feedback winding 18. When current flow in the primary winding 12 reaches a stable saturation level, the induced voltage across the feedback winding 18 would be reduced to zero so that there will no longer by any positive feedback. Prior to this, the positive feedback voltage across the secondary feedback winding 18 has discharged the capacitor 20 through the relatively low impedance of the feedback winding 18 while delivering base current to the transistor 10. The flow of discharge current is substantially greater than the charging current through the relatively high resistance of the resistor 22. Thus, a negative charge is developed across the capacitor 20 prior to saturation tending to limit the maximum emitter-to-base input voltage level to approximately the saturation level. As the level of the positive feedback voltage declines as the collector current flow through the primary winding 12 approaches saturation, the input voltage applied to the base of transistor 10 quickly reaches a value below the positive saturation level even before the positive voltage across the feedback winding 18 does due to the subtractive effect of the negative potential developed across the capacitor 20. This inhibits further increase of collector current through the primary winding 12 thus further decreasing the positive feedback level induced across feedback winding 18. The further decrease in the feedback voltage across the feedback winding 18 has a degenerative effect that quickly reduces the net input level at the base of the transistor 10 to the cutoff level. As the level of collector current flow reaches its peak, the input at the base of transistor 10 falls below the saturation level so that, as the current through the primary winding 12 decreases, the voltage polarity induced across the feedback winding 18 reverses to drive the base well beyond cutoff. Further oscillatory transients due to the inductive-capacitive coupling of the input and feedback elements are rapidly damped leaving a negative voltage charge on the capacitor 20 to maintain the transistor 10 cut off with the circuit in its initial transient state. The pulse of current flow through the primary winding 12 of the pulse transformer 14 produces a corresponding pulse output on the secondary output winding 16 which wound in either direction depending upon the desired polarity and phasing of the output.

Thereafter, the negative charge remaining on the capacitor 20 is gradually removed by the positive current flowing through the high valued resistor 22 until the predetermined positive input voltage level exceeding cutoff is again reached to initiate another pulse cycle. The RC time constant of the resistor 22 and capacitor 20 determines the pulse repetition rate in operation of the conventional blocking oscillator circuit. Thus, the interval between pulses may vary simply by changing these values using conventional variable resistors and capacitors. However, the pulse duration itself depends solely upon the delay effect caused by the inherent resonant response provided by the inductance of the windings and capacitance between the pulse transformer windings and within the transistor. These reactance parameters cannot generally be varied without changing the circuit elements themselves, which even then only permits limited variation in the resonant characteristics determinative of the pulse width. Even with specially selected pulse transformer and transistor components, the conventional blocking oscillator arrangements can achieve maximum pulse durations of only thirty microseconds or less.

With the improvement in accordance with this invention, which includes the diode 24 and variable resistor 26 coupled to form a shunt in parallel across the capacitor 20, pulse widths of substantially greater maximum duration can be achieved and the pulse widths selectively controlled simply by varying the resistance in the shunt path with setting of the tap on the variable resistor 26.

In operation, the improved circuit of this invention is similar to that of the conventional common emitter blocking oscillator previously described with several important exceptions. With the circuit initially in a quiescent state during the interval between pulses or when operating power is first applied, the capacitor 20 is slowly charged to the predetermined level by the flow of charging current from the B+ supply through the resistor 22. When the input level at the base of the transistor 10 exceeds the cutoff level, the flow of collector current through the primary winding 12 of the transformer increases to start the regenerative process.

Initially the positive feedback voltage is developed across the feedback winding 18 increasing the input at the base of the transistor 10 while at the same time discharging the capacitor 20 as before in delivering base current to the transistor 10. However, in this case, after the positive voltage on the capacitor 20 has been discharged and a negative charge starts to develop across it, the diode 24 that was previously non-conducting becomes biased in the forward direction so that current flows through this shunt path limiting further discharge.

With the variable resistor 26 set at its minimum resistance value, the improved circuit of the invention provides maximum pulse widths. Assuming that the variable resistor 26 is set for zero resistance, for example, only the very small forward resistance of the diode 24 is present in the shunt path. In that case, discharge of the capacitor 20 is limited so that the negative voltage across it cannot exceed the small forward voltage drop across the diode 24. Accordingly, the upper terminal of the feedback winding 18 connected to the upper plate of the capacitor 20 is held approximately at or slightly below ground potential with substantially all of the current flow being supplied through the shunt path. Without a negative charge developed on the capacitor 20 to be subtracted from the positive voltage across the feedback winding 18, the entire positive feedback signal is applied as an input signal to the base of the transistor 10 so that the maximum emitter-to-base input level substantially exceeds that needed for saturation. This is in contrast to the operation of the conventional circuit wherein the negative charge developed on the capacitor 20 is subtracted from the positive feedback voltage so that the emitter-to-base input level does not substantially exceed the saturation level.

Subsequently, as a result of the regenerative process, the collector current flow through the primary winding 12 approaches its maximum saturation level. The rate of current increase then begins to drop off lowering the level of positive feedback voltage induced across the feedback winding 18 by the inductive coupling. However, with no negative charge on the capacitor 20 to assist in reducing the input level at the transistor base, the level of the positive feedback voltage developed across the feedback winding 18 must itself be reduced to the saturation level before the reduction in collector current flow through the primary winding 12 begins. Obviously, this takes a longer period of time than that required in the operation of the conventional circuit so that initiation of the degenerative effect that cuts off the collector current flow to terminate the output pulse is substantially delayed. In addition, the high input level at the base substantially exceeding the saturation level produces increased base current flow through the feedback winding 18 which, due to its self-inductance effect opposing current changes, further delays the lowering of the input at the base to the saturation level where the degenerative process leading to cutoff of the pulse begins. In this way, using circuit components which in a conventional common emitter blocking oscillator can produce pulses of only thirty microseconds duration or less, pulse widths of fifty microseconds or more can be achieved.

The variable resistor 26 can be employed for introducing a selected resistance into the shunt path through the diode 24 to selectively limit the amount of negative charge developed on the capacitor 20 instead of entirely preventing it. By this means, the pulse width may be varied from the maximum duration obtainable with only the diode 24 in the shunt path to a minimum determined by the maximum resistance setting of the variable resistor 26.

Because the negative charge on the capacitor 20 is limited during generation of the pulse, after the transients have been damped out, s substantially smaller negative voltage is left stored across it at the beginning of the quiescent interval between pulses. Therefore, as compared with the conventional circuit arrangement, less charging from the B+ supply through the resistor 22 is required to raise the potential on the capacitor to where the input to the base of the transistor 10 exceeds the cutoff level so as to initiate another pulse cycle. Accordingly, a corresponding increase in the pulse repetition rate is also achieved for the free-running type of operation. Of course, the repetition rate may be appropriately adjusted to restore the longer interval simply by using a larger resistance value for the resistor 22 to reduce the flow of charging current proportionately thus increasing the RC time constant.

Figure 2:
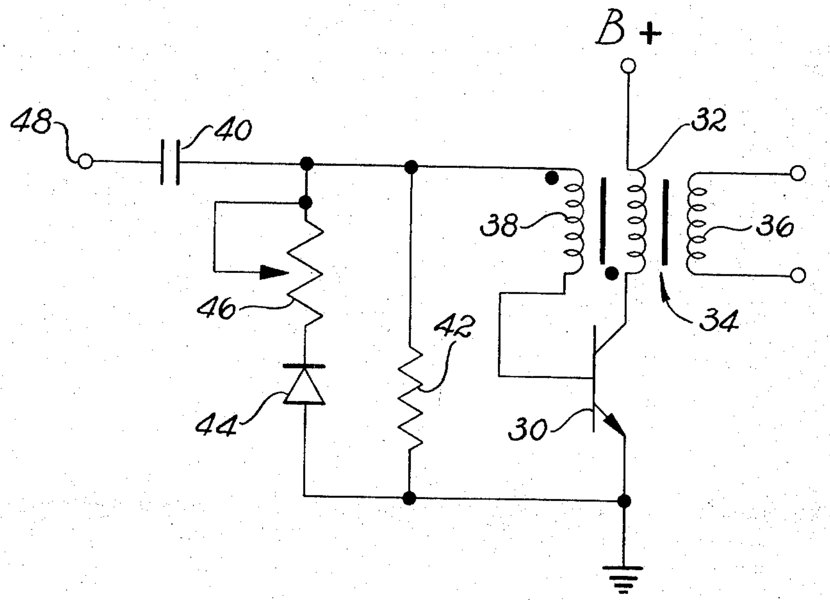

Referring now to FIG. 2, the improvement in accordance with the invention is shown incorporated in a common emitter blocking oscillator circuit of the triggered type to provide extended pulse widths of selectively variable duration. In this modification, the active amplifier element likewise consists of an NPN transistor 30 with its emitter connected in a conventional manner to ground (or negative potential) and its collector terminal connected to a B+ positive power supply through primary winding 32 of a pulse transformer arrangement 34 with inductively coupled secondary output and feedback windings 36 and 38, respectively. The feedback winding 38 has one of its terminals connected to the base of the transistor 30 and its other terminal connected to one plate of an input capacitor 40 through which positive-going trigger pulses are applied to initiate a pulse cycle as hereinafter described. The last mentioned terminal of the feedback winding 38 is also connected to the emitter of the transistor 30 at ground potential through a relatively high valued input resistor 42 across which the positive-going trigger pulses passed by the input capacitor 40 are applied. In accordance with the improvement of this invention, a series connected diode 44 and variable resistor 46 are coupled in parallel with the input resistor 42 to form a variable low resistance shunt path when a voltage of negative polarity appears across the resistor 42, the anode of the diode 44 being coupled to the transistor emitter at ground potential with its cathode to the common connection between the capacitor 40 and the upper terminal of the feedback winding 38.

With the shunt path elements 44 and 46 disconnected, (or a maximum resistance value for the resistor 46) this circuit essentially constitutes a conventional common emitter blocking oscillator operated in a triggered mode. With the circuit in its quiescent state, a positive-going triggering pulse is applied to the input terminal 48 which is normally held at ground potential. The leading edge of the triggering pulse is differentiated through the capacitor 40 to appear as a positive voltage spike across the input resistor 42. This positive voltage reaches the base terminal of the transistor through the feedback winding 38 resulting in a base-to-emitter input level above cutoff initiating the pulse cycle. The resulting increase of collector current flow through the primary winding 32, as previously described in connection with the circuit of FIG. 1, induces a positive feedback voltage across the feedback winding 38 driving the base input level more positive to increase the collector current flow. This regenerative effect quickly drives the transistor 30 to saturation. With the positive feedback voltage being generated, the upper terminal of the feedback winding 38 becomes negative with respect to its lower terminal that is coupled to the transistor base, thus tending to discharge the capacitor 40 in delivering base current to the transistor 30. In the conventional circuit, a negative voltage is thus developed across the capacitor 40 during the regenerative cycle reducing the net input voltage level at the base. Thus, the input level at the base is nearer the saturation level at its maximum and thus falls below saturation more quickly as the rate of increase in the collector current flow through the primary winding 32 begins to fall off.

In contrast, with the diode 44 and the variable resistor 46 coupled to form a relatively low resistance shunt path in parallel with the output resistor 42, discharging of the capacitor 40 to a substantial negative voltage level is limited or prevented. Thus, the level of the voltage across the feedback winding 38 must reach a much lower level than in the conventional circuit before the net input at the base of the transistor 30 declines below the saturation level to initiate the degenerative effect that results in cutoff to end the pulse. Also, as pointed out in connection with FIG. 1, the effect of the diode 44 in limiting the negative potential at the upper feedback winding terminal causes the base to be driven substantially beyond saturation so that the higher base current flow through the feedback winding 18 is delayed by the self-inductance effect of the winding opposing current changes to further assist in extending the pulse duration. As noted in connection with the free-running embodiment of FIG. 1, the extended pulse width can be selectively varied by merely adjusting the tap on the variable resistor 46 with maximum pulse durations being achieved with minimum resistance.

A typical example of circuit values and components used in the construction of improved blocking oscillators of both the free-running and triggered type as shown in FIGS. 1 and 2, respectively, may be as follows. For the free-running type as shown in FIG. 1, the transistor 10 with the designation 2N697 and the pulse transformer 14 with the designation PCA 5556 are used. Input resistor 42 would have a value of 10,000 ohms with the variable resistor 26 being selectively variable between values of zero and any desired maximum, typically in the order of 10,000 ohms, though for maximum pulse widths no resistor need be used. The diode 24 would be one designated 1N914 with the capacitor 20 having a value of 0.01 microfarads. For the triggered embodiment as shown and described in connection with FIG. 2, the transistor 30 with the designation 2N697 and an equal turns ratio transformer 34 designated PCA 4617 are used. Input resistor 42 would have a resistance value of 10,000 ohms with the variable resistor 46 being selectively settable at from zero to approximately 10,000 ohms maximum. The input capacitor 40 would have a value of 0.001 microfarads with the diode 44 being one designated 1N914.

Although the invention has been described herein with reference to two particular types of blocking oscillator configurations of the common emitter type, which are commonly used, and specific circuit values have been given to illustrate more specifically practical examples of such circuit configurations, it will be understood by those skilled in the art that the principles of the invention might be applied to provide extended pulse widths of variable duration with other conventional types of blocking oscillators and similar circuits. Specifically, similar common emitter blocking oscillator circuits may be constructed using PNP transistors, instead of the NPN type shown, with appropriate changes to the circuit elements and bias voltage supplies. Also, similar type circuits employing different feedback elements and various other types of electronic valves for the active amplifier elements, such as vacuum tubes, are subject to equivalent improvement by employing the invention as set forth in the appended claims.

What is claimed is:

1. An improved blocking oscillator circuit comprising:

an active amplifier element having an input terminal and first and second output terminals with the current flow between said output terminals occuring in response to an input signal of a given polarity applied between the first of said output terminals and said input terminal;

positive feedback means having primary means coupled to said second output terminal and secondary means for applying to said input terminal a regenerative feedback signal corresponding to the change in the current flow between said output terminals;

input circuit means including a reactive voltage storage element coupled to said first output terminal and through said secondary means to said input terminal for developing an input signal of said given polarity to initiate conduction between said output terminals; and, unidirectional circuit means for providing a relatively low impedance shunt path in parallel with said input circuit means coupled between said first output terminal and said secondary means for permitting the flow of current therethrough when the voltage across said input circuit relative to said first output terminal is opposite said given polarity, thereby limiting the magnitude of the voltage having a polarity opposite to said given polarity developed on said storage element during application of the regenerative feedback signal from said secondary means to said input terminal.

2. The improved blocking oscillator circuit of claim 1 wherein:

said positive feedback means is a pulse transformer having a primary winding for passing the current flow between said output terminal and a secondary winding inductively coupled to said primary winding and conductively coupled between said input circuit means and said input terminal for applying said regenerative feedback signal.

3. The improved blocking oscillator circuit of claim 1 wherein:

said active amplifier element is a transistor with the input terminal constituting the base, the first output terminal constituting the emitter and the second output terminal constituting the collector.

4. The improved blocking oscillator circuit of claim 3 wherein:

said transistor is operated in a common emitter mode with its emitter coupled directly to a first source of fixed potential and its collector coupled through said primary means to a second source of fixed potential to provide a forward collector-to-emitter bias.

5. The improved blocking oscillator circuit of claim 1 wherein:

said input circuit means includes a reactive voltage storage element consisting of a capacitor coupled between said first output terminal and said secondary means and charging current means for supplying a limited flow of charging current to said capacitor means for developing a voltage signal of said given polarity across said capacitor to initiate current flow between said output terminals at regularly timed intervals.

6. An improved blocking oscillator circuit comprising:

a transistor having emitter, collector and base terminals with its emitter terminal coupled to a common potential source;

transformer means having inductively coupled primary and feedback windings with the primary winding coupled in series with the collector to pass current flowing through said transistor and said feedback winding being conductively coupled to the base for applying a positive feedback signal to produce a regenerative effect in response to increasing current flow through said transistor;

circuit means including an impedance element coupled in series between said emitter and said secondary winding for developing a voltage signal of said given polarity to be applied through said feedback winding to said base and including input means for developing said voltage signal across said impedance means to an amplitude in excess of the emitter-to-base cutoff level for said transistor thereby initiating the conduction of collector current through said primary winding to produce the positive feedback signal; and, a unidirectional circuit means coupled in parallel with said impedance means for providing a relatively low impedance shunt path in its forward biased direction for limiting the magnitude of voltage having a polarity opposite said given polarity which may be developed across said impedance means during the occurrence of said regenerative feedback.

7. The improved blocking oscillator circuit of claim 6 wherein:

such circuit means includes a capacitor coupled to said feedback winding capable of storing a charge having a voltage of said opposite polarity produced by current flow through said feedback winding to said base; and, said unidirectional circuit means being responsive to the development of said opposite polarity voltage to pass a selective proportion of the current flowing through said feedback winding for limiting the opposite polarity voltage charge on said capacitor.

8. The improved blocking oscillator circuit of claim 7 wherein:

said capacitor constitutes said impedance element and said input means constitutes a substantially constant current source for supplying charging current to said capacitor for developing said voltage signal of said given polarity.

* * * * *